United States Patent
Fackenthal et al.

(10) Patent No.: US 7,034,732 B1
(45) Date of Patent: Apr. 25, 2006

(54) MULTI-STAGE DIGITAL-TO-ANALOG CONVERTER

(75) Inventors: Richard E. Fackenthal, Folsom, CA (US); Matthew G. Dayley, Placerville, CA (US); Saad P. Monasa, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/026,906

(22) Filed: Dec. 30, 2004

(51) Int. Cl.
*H03M 1/66* (2006.01)

(52) U.S. Cl. ..................... 341/146; 341/144
(58) Field of Classification Search .............. 341/146, 341/144, 145, 153
See application file for complete search history.

(56) References Cited

U.S. PATENT DOCUMENTS

| | | | | |
|---|---|---|---|---|
| 4,202,042 A * | 5/1980 | Connors et al. | ............ | 341/144 |
| 4,918,448 A * | 4/1990 | Hauviller et al. | ........... | 341/145 |
| 5,257,027 A * | 10/1993 | Murota | ...................... | 341/153 |
| 5,489,904 A * | 2/1996 | Hadidi | ........................ | 341/156 |
| 5,745,064 A * | 4/1998 | Ohya | .......................... | 341/144 |
| 5,748,128 A * | 5/1998 | Bruccoleri et al. | ......... | 341/144 |
| 5,914,682 A * | 6/1999 | Noguchi | ..................... | 341/145 |
| 6,466,149 B1* | 10/2002 | Tabler | ........................ | 341/144 |
| 2002/0024454 A1* | 2/2002 | Bartlett | | |

OTHER PUBLICATIONS

Brownlow et al. (PGPub 2002/0041245), Digital to analog converter and active matrix liquid crystal display, plublished Apr. 11, 2002.*

* cited by examiner

*Primary Examiner*—Jean Bruner Jeanglaude
(74) *Attorney, Agent, or Firm*—Blakely, Sokoloff, Taylor & Zafman LLP

(57) ABSTRACT

A multi-stage digital-to-analog converter has been presented. The multi-stage digital-to-analog converter may include a first digital-to-analog stage to output a first voltage and a second voltage in response to a first portion of a digital value, the first voltage being greater than the second voltage by a predetermined value, and a second digital-to-analog stage coupled to the first digital-to-analog stage to receive the first voltage and the second voltage and to generate a third voltage in between the first and the second voltages in response to a second portion of the digital value.

16 Claims, 4 Drawing Sheets

MULTI-STAGE DIGITAL-TO-ANALOG CONVERTER

FIELD OF INVENTION

The present invention relates generally to semiconductor integrated circuit, and more particularly, to digital-to-analog converters (D2A converters).

BACKGROUND

Digital-to-analog converters are common components in semiconductor integrated circuits. In general, a D2A converter converts a given digital value to an analog signal (e.g., an analog voltage) associated with the given digital value. Currently, D2A converters can be designed to provide various resolutions. However, the higher the resolution of a D2A converter, the greater the die area occupied by the D2A converter is. Thus, it is more difficult to design a D2A converter with a high resolution when the die area is limited.

Most D2A converters today typically have a 1-stage topology. For example, a typical existing D2A converter includes a long resistor ladder. The resistor ladder is driven from the top by some higher voltage (Vtop) and at the bottom by some lower voltage (Vbot, such as ground). There are tap points along the resistor ladder that provide a range of voltages in between Vtop and Vbot. The voltage step between two adjacent tap points is referred to as the resolution of the D2A converter. Today, a typical D2A converter used in some flash memory devices generally has a resolution of about 50 mV.

In order to build a D2A converter with a higher resolution, say 10 mV, using the same type of 1-stage topology, the tap points are placed much closer together. When the tap points are closer together, the circuit components (e.g., switches, etc.) that are fitted into the space from one tap point to the next are crowded together. The space from one tap point to the next is also referred to as a "tap pitch." In some integrated circuits, the tap pitch may be limited by other factors, such as contact-to-contact spacing or other litho constraints. Hence, the crowding of the circuit components worsens in these integrated circuits.

To alleviate the above problem, the tap points are pulled further apart in some existing D2A converters, but this causes the size of the overall D2A converters to increase. For example, to increase the resolution of an existing D2A converter from about 50 mV to about 10 mV, the circuit length (and thus, the circuit area) may have to increase by a factor of 5. This growth is due to both the additional resistors in the resistor ladder itself and the additional switches used to select tap points because 5 times as many switches may be used to increase the resolution by a factor of 5. Furthermore, to maintain the same resistance per tap point, the resistor ladder has to be made wider while keeping the length-to-width ratio of the resistor ladder substantially the same. Hence, the overall circuit area may increase by more than a factor of 5. In some instances, the resistor ladder area increases by a factor of as much as 25.

DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, an apparatus and a method to adjust signal timing on a memory interface have been disclosed. Numerous specific details are set forth below. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

A "machine-accessible medium," as the term is used in this document, includes any mechanism for storing or transmitting information in a form readable by a machine (e.g., a computer). For example, a machine-readable medium includes ROM; RAM; magnetic disk storage media; optical storage media; flash memory devices; electrical, optical, acoustical or other form of propagated signals (e.g., carrier waves, infrared signals, digital signals, etc.); etc.

Figure 1:
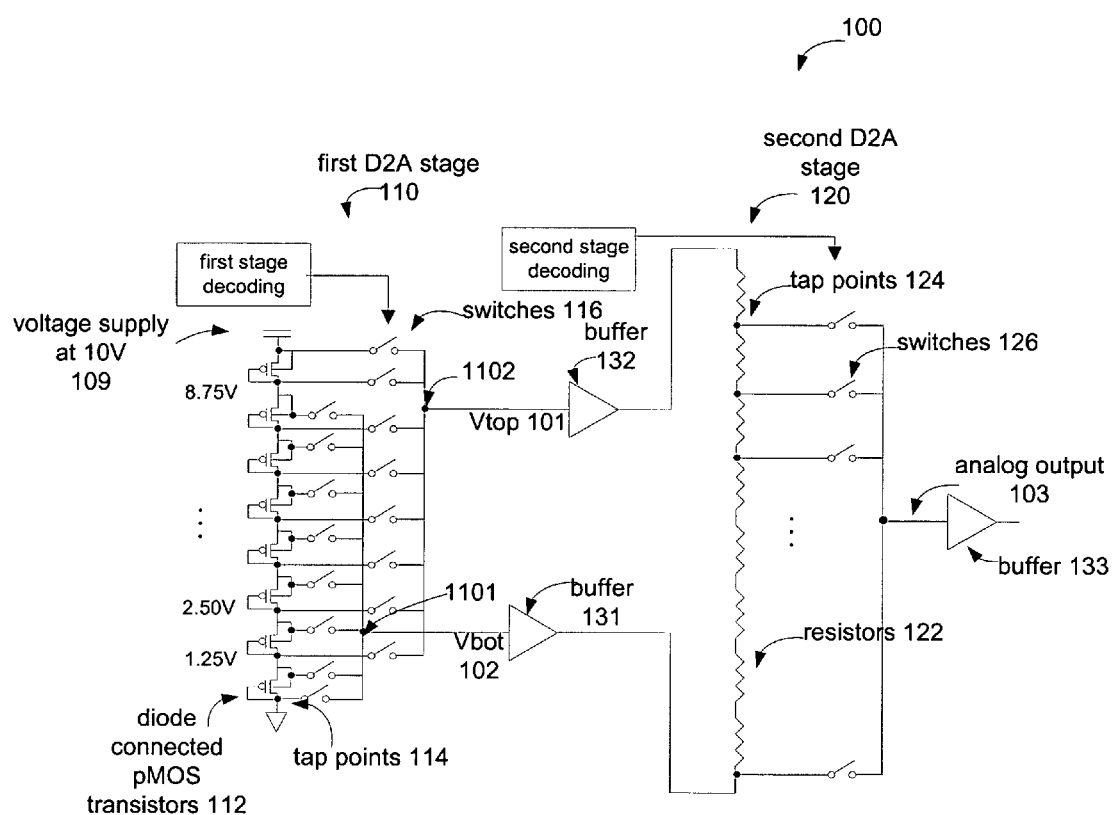
FIG. 1 illustrates one embodiment of a two-stage D2A converter.

FIG. 1 illustrates one embodiment of a two-stage D2A converter. The D2A converter 100 includes a first D2A stage 110 and a second D2A stage 120. The D2A converter 100 may further include a first buffer 131 and a second buffer 132 to couple the output of the first D2A stage 110 to the input of the second D2A stage 120.

In one embodiment, the first D2A stage 110 includes a number of diode-connected p-type Metal Oxide Semiconductor (pMOS) transistors 112 and a number of switches 116. The pMOS transistors 112 are coupled to each other in series to form a voltage divider. One end of the series of pMOS transistors 112 may be coupled to a voltage supply 109 and the other end of the series may be coupled to the ground. The pMOS transistors 112 may divide the voltage difference between the voltage supply 109 and ground into a number of intervals and provide tap points 114 in between each interval. In some embodiments, the intervals are substantially equal. For example, there may be eight pMOS transistors 112 and the voltage supply 109 is at 10V. Then the pMOS transistors 112 divide 10V into eight intervals with tap points in between these 8 intervals, and thus, each tap point is approximately +/−1.25V from the adjacent tap points. That is, the tap points 114 are at approximately 0V, 1.25V, 2.5V, . . . , up to 10V.

In some embodiments, a pair of the switches 116 is coupled to each of the tap points 114, except the tap point coupled to the ground and the tap point coupled to the voltage supply 109. One switch of the pair of switches is coupled to a first output node 1102 and the other switch is coupled to a second output node 1101. The output voltages from the first D2A stage 110 at the first and second output nodes 1102 and 1101 are Vtop 101 and Vbot 102, respectively. The switches 116 are closed or opened in response to decoding a portion of a digital value to select two adjacent tap points. For example, the switches 116 may be closed or opened in response to the three most significant digits of a 10-digit digital value.

In the above example, where the supply voltage 109 is at 10V, a first set of 8 tap points between ground and the second-to-highest voltage (i.e., 8.75V) is provided and one of which can be selected and sent to the second D2A stage 120 as Vbot 102. A second set of 8 tap points can be selected between 1.25V and 10V and sent to the top of the second D2A stage 120 as Vtop 101. In some embodiments, whenever tap N is selected from the first set of tap points, tap N+1 is automatically selected from the second set of tap points. Therefore, the selected pair of tap points are adjacent to each other so that Vtop 101 is approximately 1.25V above Vbot 102 regardless of which pair of tap points is selected. In other words, the first D2A stage 110 has a resolution of approximately 1.25V. Note that only 16 switches 116 are used in the embodiment illustrated in FIG. 1 to provide such a resolution. Furthermore, since the typical threshold voltage of pMOS transistors is below 1.25V, pMOS transistors can be used to implement the voltage divider in the first D2A stage 110 accurately. Using pMOS transistors may be more economical than using resistors to implement the voltage divider.

Referring back to FIG. 1, the output voltages, Vtop 101 and Vbot 102, from the first D2A stage 110 are input to the second D2A stage 120. Vtop 101 and Vbot 102 may be sent to the second D2A stage 120 via the buffers 132 and 131, respectively. In one embodiment, the second D2A stage 120 includes a set of resistors 122 and a set of switches 126. The set of resistors 122 may be coupled to each other in series. Vtop 101 may be applied to one end of the series and Vbot 102 may be applied to the other end of the series. The resistors 122 form a voltage divider in the second D2A stage 120 to divide the voltage difference between Vtop 102 and Vbot 101 into a predetermined number of intervals. A set of tap points 124 are provided in between each of the resistors 122 and one of the switches 126 is coupled to one of the tap points 124. The switches 126 are opened or closed in response to a second portion of the digital value to select one of the tap points 124. The voltage at the selected tap point may be output as the analog output 103, which corresponds to the digital value. In some embodiments, the analog output 103 is passed through the buffer 133 to other components in the integrated circuit. For instance, referring back to the example discussed above, the switches 116 may be closed or opened in response to the seven least significant digits of the 10-digit digital value.

As discussed in the above example, Vtop 101 may be approximately 1.25V above Vbot 102 regardless of which pair of tap points is selected in the first D2A stage 110. Therefore, to provide a resolution of approximately 10 mV in the D2A converter 100, the second D2A stage 120 has to divide the voltage difference between Vtop 101 and Vbot 102 is by 125. Hence, there are 125 resistors 122 in the second D2A stage 120 to provide 125 tap points 124. The second D2A stage 120 further includes 125 switches 126, each of which is coupled to each of the 125 tap points 124.

One advantage of the above embodiment is the reduction in die area for the given resolution. The total number of divider segments for the above embodiment for a resolution of about 10 mV is 8 (first stage)+125 (second stage)=133. The total number of switches is 16 (first stage)+125 (second stage)=141. If a 10 mV resolution D2A were to be implemented with the conventional 1-stage topology, it would require 10V/0.01V=1000 resistors and 1000 switches. Therefore, as a first-order approximation, the 2-stage implementation described above is one order of magnitude smaller than the 1-stage implementation.

Another advantage of the above embodiment is increased accuracy. By using 2 stages, the second D2A stage 120 sees a reduced potential difference from top to bottom (e.g., approximately 1.25V in the above example). Some types of resistors (e.g., diffusion resistors) suffer non-linearity problems, such as bending in the transfer function, which get worse with higher potential differences across the resistor ladder. The implementation described above reduces that potential difference, and thus, reduces the adverse affect of non-linearity in some resistors.

Figure 2:
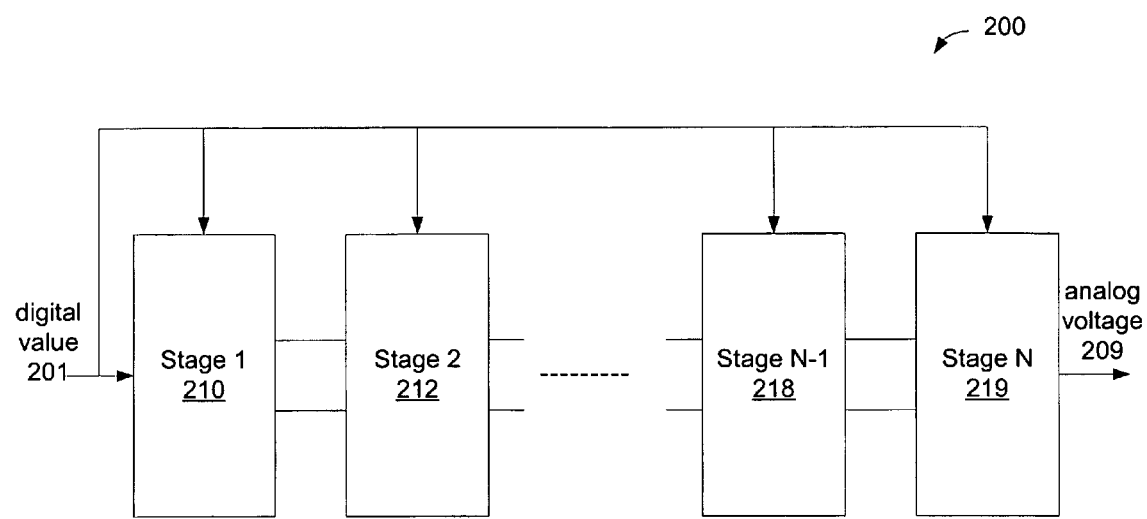
FIG. 2 illustrates a block diagram of one embodiment of a multi-stage D2A converter.

The technique discussed above may be applied to implement multi-stage D2A converters. FIG. 2 shows a block diagram of one embodiment of a multi-stage D2A converter. The multi-stage D2A converter 200 includes a number of D2A stages 210–219. The number of stages varies in different embodiments. Furthermore, some or all of the D2A stages 210–219 may be implemented in different ways. For example, one of the D2A stages 210–219 may include a set of transistors to divide a voltage difference (e.g., the difference between two input voltages from a previous stage or the difference between a supply voltage and the ground). Another one of the D2A stages 210–219 may include a set of resistors to divide a voltage difference. Some embodiments of a D2A stage have been discussed above with reference to FIG. 1.

Referring to FIG. 2, the D2A stages 210–219 are coupled to each other serially, where each D2A stage (except the last D2A stage 219) outputs two output voltages to the next stage. A digital value 201 is input to the D2A stages 210–219, where various portions of the digital value 201 are decoded. Each of the D2A stages 210–218 includes switches that select one or more tap points in response to the corresponding decoded portion of the digital value 201 to output the corresponding voltages. Finally, the last D2A stage 219 selects one analog voltage in response to the corresponding decoded portion of the digital value 201 and outputs an analog voltage 209. The analog voltage output 209 by the last D2A stage 219 is associated with the digital value 201.

Figure 3:
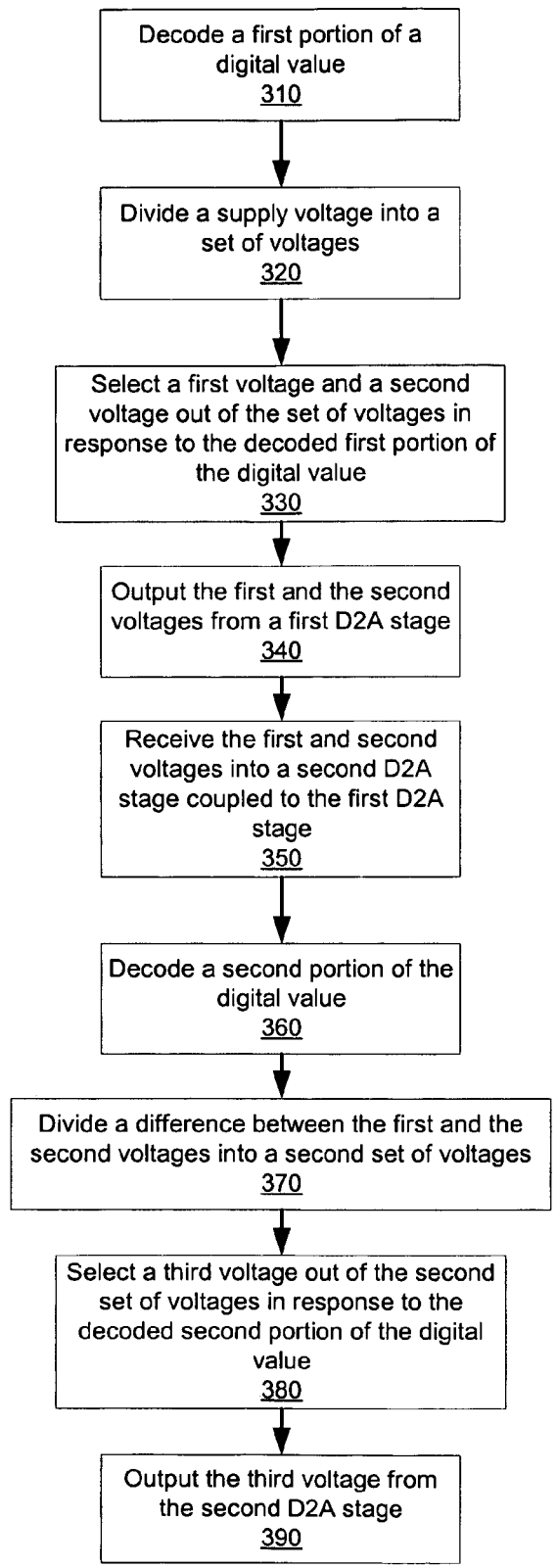
FIG. 3 shows a flow diagram of one embodiment of a process for converting a digital value to an analog signal.

FIG. 3 illustrates a flow diagram of one embodiment of a process for converting a digital value into an analog signal. The process is performed by processing logic that may comprise hardware (e.g., circuitry, dedicated logic, etc.), software (such as is run on a general purpose computer system or a dedicated machine), or a combination of both.

Processing logic decodes a first portion of digital value (processing block 310). Then processing logic divides a supply voltage into a set of voltages (processing block 320). Each of the voltage in the set may be separated from the next voltage by substantially the same voltage difference. Processing logic selects a first voltage and a second voltage out of the set of voltages in response to the decoded first portion of the digital value (processing block 330). The first and the second voltages may be a pair of adjacent voltages. Processing logic outputs the first and the second voltages from a first D2A stage (processing block 340).

In one embodiment, processing logic receives the first and the second voltages into a second D2A stage coupled to the first D2A stage (processing block 350). Processing logic decodes a second portion of the digital value (processing block 360). Processing logic divides a difference between the first and the second voltages into a second set of voltages (processing block 370). Then processing logic selects a third voltage out of the second set of voltages in response to the decoded second portion of the digital value (processing block 380). Finally, processing logic outputs the third voltage from the second D2A stage (processing block 390). The third voltage may correspond to the digital value.

Figure 4:
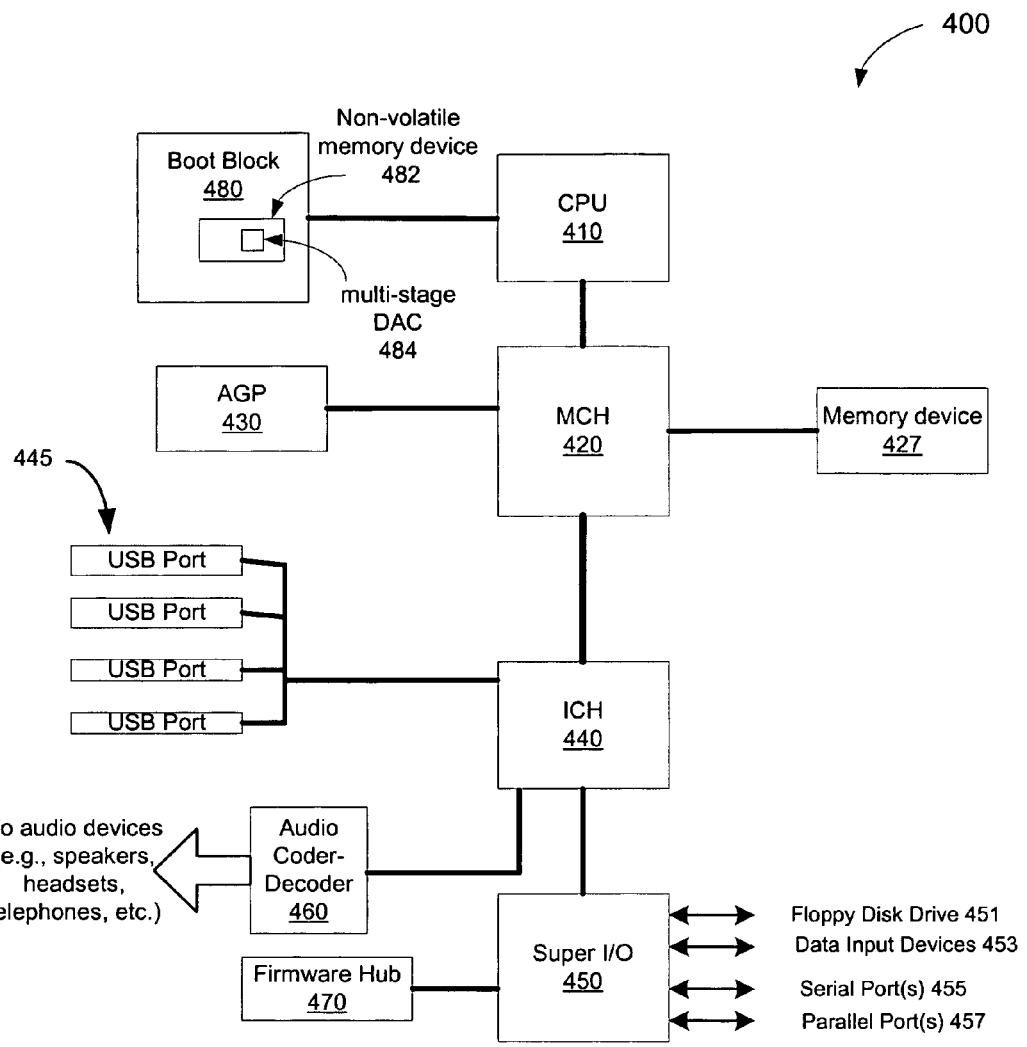
FIG. 4 illustrates an exemplary embodiment of a computer system.

FIG. 4 shows an exemplary embodiment of a computer system 400. The computer system 400 includes a central processing unit (CPU) 410, a memory controller (MCH) 420, a memory device 427, a boot block 480, a graphic port (AGP) 430, an input/output controller (ICH) 440, a number of Universal Serial Bus (USB) ports 445, an audio coder-decoder 460, a Super Input/Output (Super I/O) 450, and a firmware hub (FWH) 470.

In one embodiment, the CPU 410, the graphic port 430, the memory device 427, and the ICH 440 are coupled to the MCH 420. The MCH 420 routes data to and from the memory device 427. The memory device 427 may include various types of memories, such as, for example, dynamic random access memory (DRAM), synchronous dynamic random access memory (SDRAM), double data rate (DDR) SDRAM, etc. In one embodiment, the USB ports 445, the audio coder-decoder 460, and the Super I/O 450 are coupled to the ICH 440. The Super I/O 450 may be further coupled to a firmware hub 470, a floppy disk drive 451, data input devices 453 (e.g., a keyboard, a mouse, etc.), a number of serial ports 455, and a number of parallel ports 457. The audio coder-decoder 460 may be coupled to various audio devices, such as speakers, headsets, telephones, etc.

In one embodiment, the CPU 410 is further coupled to a boot block 480. The boot block 480 may include a non-volatile memory device 482, such as a flash memory device. Instructions and/or data for some predetermined routines may be stored in the non-volatile memory device 482. The CPU 410 may retrieve the stored instructions and/or data from the non-volatile memory device 482 in order to execute the predetermined routines. The non-volatile memory device 482 may include a multi-stage D2A converter 484 to convert digital values into analog signals. Details of some embodiments of the multi-stage D2A converter 484 have been discussed above.

Note that any or all of the components and the associated hardware illustrated in FIG. 4 may be used in various embodiments of the computer system 400. However, it should be appreciated that other configurations of the computer system may include one or more additional devices not shown in FIG. 4. Furthermore, one should appreciate that the technique disclosed is applicable to different types of system environment, such as a multi-drop environment or a point-to-point environment. Likewise, the disclosed technique is applicable to both mobile and desktop computing systems.

The foregoing discussion merely describes some exemplary embodiments of the present invention. One skilled in the art will readily recognize from such discussion, the accompanying drawings and the claims that various modifications can be made without departing from the spirit and scope of the appended claims. The description is thus to be regarded as illustrative instead of limiting.

What is claimed is:

1. An apparatus comprising:
a first digital-to-analog stage to output a first voltage and a second voltage in response to a first portion of a digital value, the first voltage being greater than the second voltage by a predetermined value, wherein the first digital-to-analog stage comprises
a first voltage divider comprising a plurality of transistors coupled to each other serially, the number of transistors being associated with the predetermined value, and
a first decoder coupled to the first voltage divider, the first decoder comprising a first plurality of switches operated in response to the first portion of the digital value; and
a second digital-to-analog stage coupled to the first digital-to-analog stage to receive the first voltage and the second voltage and to generate a third voltage in between the first and the second voltages in response to a second portion of the digital value.

2. The apparatus of claim 1, wherein the second digital-to-analog stage comprises:
a second voltage divider; and
a second decoder coupled to the second voltage divider, the second decoder comprising a second plurality of switches operated in response to the second portion of the digital value.

3. The apparatus of claim 2, wherein the second voltage divider comprises:
a plurality of resistors coupled to each other serially.

4. The apparatus of claim 3, wherein the plurality of resistors comprises one or more diffusion resistors.

5. A method comprising:
outputting a first voltage and a second voltage from a first digital-to-analog stage in response to a first portion of a digital value, the first voltage being greater than the second voltage by a predetermined value;
receiving the first voltage and the second voltage into a second digital-to-analog stage coupled to the first digital-to-analog stage;
generating a third voltage in between the first and the second voltages in response to a second portion of the digital value;
decoding the first portion of the digital value;
dividing a supply voltage into a plurality of voltages, wherein dividing the supply voltage comprises using a plurality of transistors to divide the supply voltage; and
selecting the first voltage and the second voltage out of the plurality of voltages in response to the decoded first portion of the digital value.

6. The method of claim 5, further comprising:
decoding the second portion of the digital value;
dividing a difference between the first and the second voltages into a second plurality of voltages; and
selecting the third voltage out of the second plurality of voltages in response to the decoded second portion of the digital value.

7. The method of claim 6, wherein dividing the difference between the first and the second voltages comprises dividing a difference between the first and the second voltages using a plurality of resistors.

8. The method of claim 7, wherein the plurality of resistors comprises one or more diffusion resistors.

9. A computer program product that provides instructions encoded on a computer readable medium that, if executed by a processor, will cause the processor to perform operations comprising:
outputting a first voltage and a second voltage from a first digital-to-analog stage in response to a first portion of a digital value, the first voltage being greater than the second voltage by a predetermined value;
receiving the first voltage and the second voltage into a second digital-to-analog stage coupled to the first digital-to-analog stage;
generating a third voltage in between the first and the second voltages in response to a second portion of the digital value;
decoding the first portion of the digital value;

dividing a supply voltage into a plurality of voltages, wherein dividing the supply voltage comprises using a plurality of transistors to divide the supply voltage; and selecting the first voltage and the second voltage out of the plurality of voltages in response to the decoded first portion of the digital value.

10. The computer program product of claim 9, wherein the operations further comprise:

decoding the second portion of the digital value;

dividing a difference between the first and the second voltages into a second plurality of voltages; and selecting the third voltage out of the second plurality of voltages in response to the decoded second portion of the digital value.

11. The machine-accessible medium of claim 10, wherein dividing the difference between the first and the second voltages comprises dividing a difference between the first and the second voltages using a plurality of resistors.

12. The machine-accessible medium of claim 11, wherein the plurality of resistors comprises one or more diffusion resistors.

13. A system comprising:

a first storage device to store data;

a processor coupled to the first storage device to access the data; and a non-volatile memory device coupled to the processor, the processor being operable to retrieve instructions from the non-volatile memory device, the non-volatile memory device having a multi-stage digital-to-analog converter comprising:

a first digital-to-analog stage to output a first voltage and a second voltage in response to a first portion of a digital value, the first voltage being greater than the second voltage by a predetermined value, wherein the first digital-to-analog stage comprises a first voltage divider comprising a plurality of transistors coupled to each other serially, the number of transistors being associated with the predetermined value, and a first decoder coupled to the first voltage divider, the first decoder comprising a first plurality of switches operated in response to the first portion of the digital value; and a second digital-to-analog stage coupled to the first digital-to-analog stage to receive the first voltage and the second voltage and to generate a third voltage in between the first and the second voltages in response to a second portion of the digital value.

14. The system of claim 13, wherein the second digital-to-analog stage comprises:

a second voltage divider; and a second decoder coupled to the second voltage divider, the second decoder comprising a second plurality of switches operated in response to the second portion of the digital value.

15. The system of claim 14, wherein the second voltage divider comprises:

a plurality of resistors coupled to each other serially.

16. The system of claim 15, wherein the plurality of resistors comprises one or more diffusion resistors.

* * * * *